United States Patent [19]

Jedlicka et al.

[11] Patent Number: 5,604,362

[45] Date of Patent: Feb. 18, 1997

[54] FILTER ARCHITECTURE FOR A PHOTOSENSITIVE CHIP

[75] Inventors: Josef E. Jedlicka, Rochester; Brian T. Ormond; Debra S. Vent, both of Webster, all of N.Y.

[73] Assignee: Xerox Corporation, Stamford, Conn.

[21] Appl. No.: 603,513

[22] Filed: Feb. 20, 1996

Related U.S. Application Data

[63] Continuation of Ser. No. 427,400, Apr. 24, 1995, abandoned.

[51] Int. Cl.$^6$ ................................................. H01L 27/148
[52] U.S. Cl. ........................... 257/233; 257/432; 257/433; 257/443; 257/440; 257/643
[58] Field of Search ............................. 257/222, 233, 257/432, 437, 443, 636, 643, 440, 433, 632, 791

[56] References Cited

U.S. PATENT DOCUMENTS 5,340,619  8/1994  Chen et al. ............................ 424/498

FOREIGN PATENT DOCUMENTS

| 63-304675 | 12/1988 | Japan | 257/440 |
| 4-111354 | 4/1992 | Japan | 257/432 |
| 5-21771 | 1/1993 | Japan | 257/432 |

*Primary Examiner*—Minhloan Tran
*Attorney, Agent, or Firm*—R. Hutter

[57] ABSTRACT

In a photosensitive chip suitable for full-color imaging, separate photosites on the chip correspond to different primary colors in an original image. Each primary-color photosite is filtered with a polyimide doped to a particular primary color. The red-filtering layer and the blue-filtering layer are left on the non-photosensitive portions of the main surface of the chip, and together serve as a non-reflective area which prevents stray reflections from the chip. The chip is further provided with a base layer of infrared-filtering polyimide.

9 Claims, 2 Drawing Sheets

FIG. 1
PRIOR ART
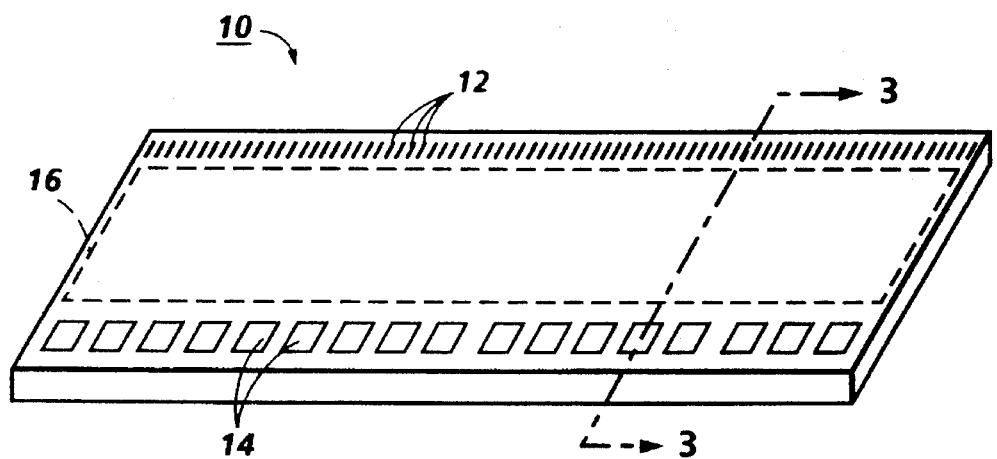
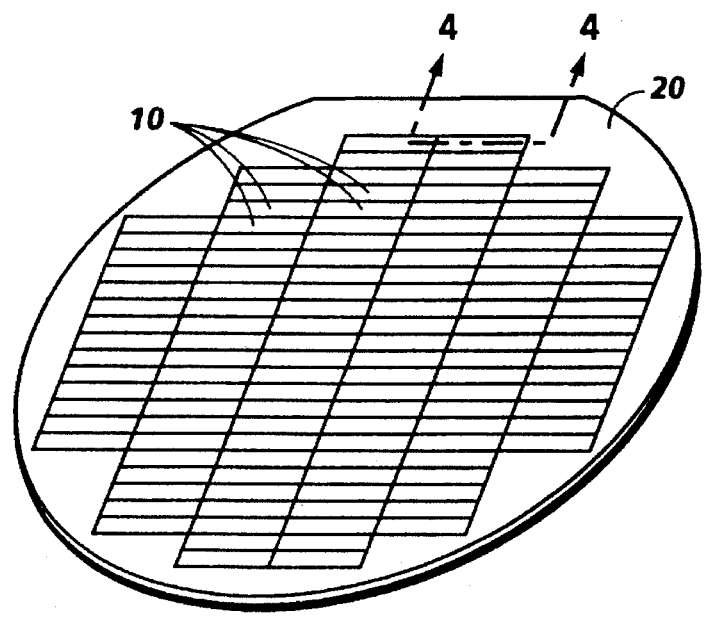
FIG. 2

FIG. 3
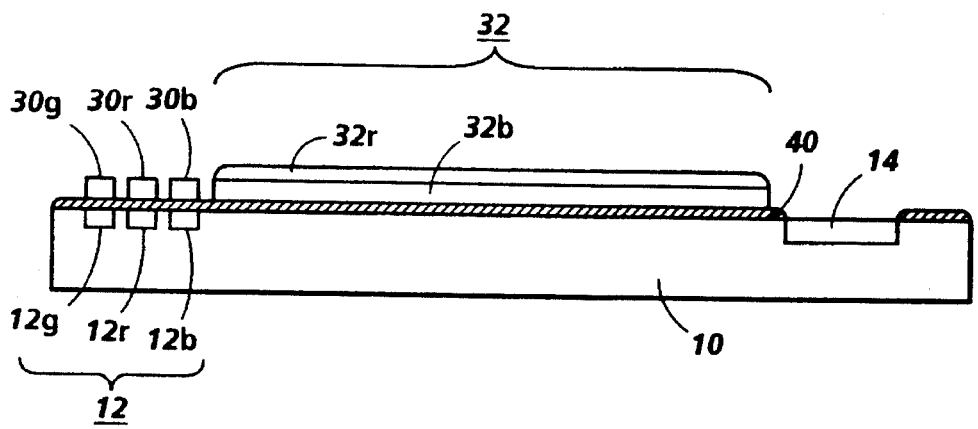
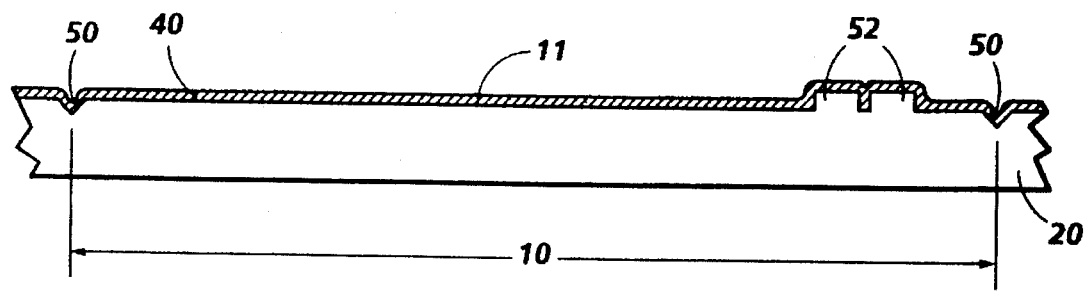
FIG. 4

FILTER ARCHITECTURE FOR A PHOTOSENSITIVE CHIP

This is a continuation of application Ser. No. 08/427,400, filed Apr. 24, 1995, now abandoned

CROSS REFERENCE

Cross-reference is made to co-pending patent application Ser. No. 08/328,789, filed Oct. 28, 1994, entitled "Precision Dicing of Silicon Chips From a Wafer," assigned to the assignee hereof.

1. Field of Invention

The present invention relates to an arrangement of color filters relative to photosensors on a photosensitive chip, as would be used, for example, in a full-color digital copier or scanner.

2. Background of the Invention

Image sensors for scanning document images, such as charge coupled devices (CCDs), typically have a row or linear array of photosites together with suitable supporting circuitry integrated onto a silicon chip. Usually, a sensor is used to scan line by line across the width of a document with the document being moved or stepped lengthwise in synchronism therewith. A typical architecture for such a sensor array is given, for example, in U.S. Pat. No. 5, 153,421.

In a full-page-width image scanner, there is provided a linear array of small photosensors which extends the full width of an original document, such as 11 inches. These photosensors may be spaced as finely as 600 to the inch on each chip. When the original document moves past the linear array, each of the photosensors converts reflected light from the original image into electrical signals. The motion of the original image perpendicular to the linear array causes a sequence of signals to be output from each photosensor, which can be converted into digital data.

A currently-preferred design for creating such a long linear array of photosensors is to provide a set of relatively small semiconductor chips, each semiconductor chip defining thereon a linear array of photosensors along with ancillary circuit devices. These chips are typically approximately ¾ inches in length; in order to create a practical full-page-width array, as many as twenty or more of these chips can be abutted end-to-end to form a single linear array of photosensors.

With the gradual introduction of color-capable products into the office equipment market, it has become desirable to provide scanning systems which are capable of converting light from full-color images into separate trains of image signals, each train representing one primary color. In order to obtain the separate signals relating to color separations in a fullcolor image, one technique is to provide on a semiconductor chip multiple parallel linear arrays of photosensors, each of the parallel arrays being sensitive to one primary color. Typically, this arrangement can be achieved by providing multiple linear arrays of photosensors which are physically identical except for a translucent primary-color overlay over the photosensitive areas, or "photosites", for that linear array. In other words, the linear array which is supposed to be sensitive to red light only will have a translucent red layer placed on the photosites thereof, and such would be the case for a blue-sensitive array and a green-sensitive array. As the chip is exposed to an original full-color image, only those portions of the image which correspond to particular primary colors will reach those photosensors assigned to the primary color.

The most common substances for providing these translucent filter layers over the photosites is polyimide or acrylic. Polyimide is typically applied in liquid form to a batch of photosensor chips while the chips are still in undiced, wafer form. After the polyimide liquid is applied to the wafer, the wafer is centrifuged to ensure an even layer of a particular polyimide. In order to obtain the polyimide having the desired primary-color-filtering properties, it is well known to dope the polyimide with either a pigment or dye of the desired color, and these dopants are readily commercially available. When it is desired to place different kinds of color filters on a single chip, a typical technique is to first apply an even layer of polyimide over the entire main surface of the chip (while the chip is still part of the wafer) and then remove the unnecessary parts of the filter by, for example, photo-etching. Typically, all of the filter layer placed over the chip is removed except for those areas over the desired set of photosites.

One peculiarity of photosensitive devices created in semiconductor wafers is that, regardless of the presence of filters for visible light on the photosites, the photosensors remain sensitive to certain wavelengths of non-visible light, particularly infrared light. Thus, if it is desired to have a photosensor sensitive only to green visible light, merely placing a green filter over the photosite will not render a photosensor which is sensitive to green light only; infrared light not visible to the human eye will reach the photosensor as well, thus distorting the "green" signal. The addition of stray infrared light will create a signal that will indicate more green light than is actually in the image being scanned. It is known, in the art of color copiers and scanners, to provide a solid glass infrared filter over photosensitive chips. However, because the infrared filters are made of solid glass, they must be provided with suitable mounting hardware, which significantly contributes to the cost and bulk of the scanning apparatus.

Regardless of the specific type of mounting of a photosensitive chip or chip array in a scanning apparatus, one common practical problem has been spurious signal output from the photosensors as a result of stray reflected light from within the scanning apparatus. When light, such as from a Selfoc® lens array which is commonly used in scanning apparatus, is directed generally to one or more chips, not all of the light directed to the chip is absorbed by a photosensor. Silicon chips are naturally reflective, and very often other areas on the main surface of a chip exclusive of the photosites are covered with aluminum, which can be highly reflective. Thus, light directed generally toward the chip can be to a great extent reflected by reflective areas on the chip exclusive of the photosites. This light reflected from the chip can be reflected from other neighboring parts within the scanning apparatus and then be redirected as unwanted light onto the photosites.

In the prior art, U.S. Pat. No. 5,340,619 discloses an optoelectronic device wherein a substrate is coated, and then portions of the coating are ablated with a laser. Color filter materials are placed in the ablated openings and cured.

SUMMARY OF THE INVENTION

According to one aspect of the present invention, there is provided a semiconductor chip, comprising a main surface including a photosite in a portion of the main surface, and a layer of polyimide disposed over the photosite. The polyimide is adapted to filter infrared light.

According to another aspect of the present invention, there is provided a semiconductor chip, comprising a main surface including a first photosite and a second photosite in a portion thereof. A first primary color filter layer is disposed at least over the first photosite, and a second primary color filter layer is disposed at least over the second photosite. A portion of the first primary color filter layer overlays a portion of the second primary color filter layer on a portion of the main surface exclusive of a photosite, defining thereon an area substantially non-reflective of visible light.

According to another aspect of the present invention, there is provided a semiconductor wafer defining a plurality of chip areas on a main surface thereof. Each chip area defines a circuit set separable into a separate chip, the wafer further defining an etched groove between chip areas. A layer of polyimide covers at least one chip area, and extends from a bottom of the etched groove to at least the main surface of the wafer.

BRIEF DESCRIPTION OF THE DRAWINGS

FIG. 1 is a perspective view, showing a typical chip for use with the present invention, in isolation;

FIG. 2 is a perspective view showing, a silicon wafer relevant to the present invention;

FIG. 3 is a cross-sectional view through line 3—3 in FIG. 1, showing elements specific to the present invention; and FIG. 4 is a cross-sectional view through line 4—4 in FIG. 2, showing elements specific to the present invention.

DETAILED DESCRIPTION OF THE INVENTION

FIG. 1 is a perspective view showing, in isolation, one photosensitive chip 10 relevant to the claimed invention. The chip 10 is generally made of a silicon substrate, as is known in the art, in which circuitry and other elements are formed, such as by photolithographic etching. For purposes of the claimed invention, the most relevant structures are a linear array of photosites 12, each of which forms the photosensitive surface of photosensor circuitry within the chip, and a set of bonding pads 14. The photosites 12 are typically arranged in a linear array along one main dimension of the chip, with each photosite along the array corresponding to one pixel in the image signal. As will be described in detail below, the photosite 12 for each pixel may further include photosites, arranged orthogonal to the direction of the linear array, for separate primary colors corresponding to the pixel.

The bonding pads 14 are distinct surfaces on the main surface of the chip 10, and are intended to accept wire bonds attached thereto. The bonding pads 14 thus serve as the electronic interface between the chip 10 and any external circuitry. The circuitry for obtaining signals related to light directed to the photosites 12, and unloading image data from the chip 10 is generally indicated as 16, and is, in the illustrated embodiment, generally disposed between the linear array of photosites 12 and a substantially linear array of bonding pads 14.

Chips such as 10 are typically formed in batches on silicon wafers, which are subsequently cleaved, or "diced", to create individual chips. Thus, all of the photosites, bonding pads and circuitry for relatively large number of chips are etched simultaneously onto a single wafer. A typical silicon wafer which is five inches in diameter may be capable of yielding as many as three hundred chips.

FIG. 2 shows a typical silicon wafer, in isolation, wherein a relatively large number of chips 10 are created in the wafer 20 prior to dicing thereof. It will thus be seen that each individual chip 10 in the main surface of a wafer 20 comprehends a distinct chip area within the main surface of the wafer 20. As used in the claims herein, the phrase "chip area" will refer to a defined area within the main surface of a wafer which is intended to comprise a discrete chip 10 after the dicing step, when individual chips 10 are separated from the rest of the wafer 20.

FIG. 3 is a sectional elevational view through line 3—3 of Figure 1, showing the chip 10 with the arrangement of filters according to the present invention. On the main surface of chip 10 there is provided three separate photosites which together comprise a pixel photosite such as 12 shown in FIG. 1. In a full-color-sensitive chip 10, each pixel photosite 12 comprises three distinct photosensors, each sensitive to one primary color. As shown in the FIG. 3 embodiment, within each pixel photosite 12 is disposed a photosensor 12g, sensitive to green light, a photosensor 12r sensitive to red light, and a photosensor 12b, sensitive to blue light. The three photosensors are on the whole identical as circuit elements except that the photosensitive surface of each photosensor 12g, 12r, 12b is superimposed thereon by a distinct primary-color filter, here shown as 30g, 30r, and 30b. As is known in the art, such filters preferably comprise a polyimide or acrylic which has been doped with a commercially-available dye or pigment blended to yield a primary color filter. As is further known in the art, it is common to provide filters such as 30g, 30r, and 30b, by first placing a polyimide in liquid form over the entire main surface of the chip 10, and then removing the hardened polyimide by photolithography in all areas of the chip except where the filter area is desired.

According to one aspect of the present invention, it is desirable, in the cases of the red filter 30r and blue filter 30b, not to remove the filter layers in these steps for the bulk of the main surface of the chip 10. As shown in the cross-section of FIG. 3, layers 32b and 32r represent residual layers of blue and red-filtering polyimide (or, alternately, acrylic) which are caused to remain on the main surface of chip 10. It has been found that the combination of red polyimide such as 32r and blue polyimide 32b, when one layer is allowed to overlay the other, serves as an effective absorptive layer which is non-reflective of stray light directed generally to the chip 10. By providing this non-reflective area, here generally indicated as 32, the incidence of stray reflections within a larger scanning apparatus is minimized because the bulk of the light which is directed toward chip 10 but not absorbed by any of the photosites 12 will not be reflected from a silicon or aluminum surface of chip 10. The non-reflective area 32 thus generally minimizes stray light within the scanning apparatus.

Because the layers 32r and 32b of polyimide must be applied to the main surface of chip 10 in order to place filters 30r and 30b thereon, creation of the non-reflective layer 32 is easily accomplished. As shown in FIG. 3, layer 32r is placed over layer 32b, but it will be apparent that the order of placing various polyimide layers may be varied for convenience.

Also shown on the main surface of chip 10, between the filter layers such as 30 or 32 and the main surface of chip 10, is a base polyimide layer 40. It will be noticed that the polyimide layer 40 extends entirely over the main surface of chip 10, except for the area exposed for bonding pad 14; the polyimide layer 40 extends over every primary color photosensor such as 12g, 12r, or 12b. This polyimide layer 40 serves a number of functions.

First, the polyimide layer 40 interposed between the main surface of the chip 10 and the filter layers may act as a "primer" for improved adhesion of the filter layers on the chip. Another key function of polyimide layer 40 is that the polyimide layer 40 may be doped with a dye or pigment which causes the polyimide in layer 40 to block transmission of infrared light. As mentioned above, it is a property of photosensitive semiconductors that the range of wavelengths to which they are sensitive is greater than that of the human eye, and that even filtering out all but one primary color in the visible spectrum will often still leave the photosensor sensitive to infrared light. To avoid spurious signals relating from infrared light, each primary color photosensor is filtered for infrared light by an infrared-blocker dye or pigment in the polyimide of layer 40. The use of an infrared blocker within the polyimide covering all photosites on a chip obviates the need, which is apparent in prior art full-color scanners and copiers, to provide infrared filtering on a separate piece of glass mounted in fixed relation to the chip.

Another useful function of polyimide layer 40 directly disposed on the main surface of a semiconductor chip is that the application of a polyimide layer 40 improves the efficacy of the dicing process when a chip such as 10 is diced from a wafer 20. FIG. 4 is a cross-sectional view showing the area of a wafer 20 corresponding to an individual chip 10 before the dicing step, but after the application of polyimide layer 40. As is known, for example, from U.S. Pat. No. 4,814,296, one technique for obtaining accurately dimensioned chips for use in a chip array has been to create in the surface of the wafer 20 a set of photolithographically-etched V-grooves, here shown by 50, which define precisely the intended boundaries of a particular chip 10. In the patent application cross-referenced herein, it was disclosed that the application of polyimide in the "streets" between areas corresponding to neighboring chips within a wafer, in such a manner as to cause a concave meniscus within the street, serves to reduce the damage caused by microchipping of small silicon particles when the chips are diced mechanically, such as with a diamond blade.

According to the present invention, the polyimide layer 40 can be applied generally over the entire surface of a wafer 20, in such a manner that the depth of the polyimide 40 extends from the bottom of a V-groove such as 50 and over the main plane, here shown as 11, of the wafer 20. Another function of the base polyimide layer 40 is that even a thin layer of polyimide 40 can partially planarize the surface of the chip so that particular circuit structures which create protrusions in the chip, such as 52, can be smoothed out. When protrusions such as 52 define right angles with respect to the main plane 11 of the wafer 20, polyimide layers, such as for the filter layer 32r and 32b, can become dammed behind a protrusion 52, causing an undesirable clumping of liquid polyimide at the right angle. A relatively thin base layer of clear or infrared-blocking polyimide such as 40 can be applied generally over the surface of a chip 10 so that subsequent layers, such as 32r or 32b in FIG. 3, will be applied evenly over the relatively smoothed-out surface of polyimide layer 40.

A typical desirable thickness for polyimide layer 40 is from 1.2 to 2.0 micrometers, for a chip having V-grooves of 5.0 micrometers of depth and protrusions 52 typically of 1.2 micrometers in height. It has been found, that when such a polyimide layer is centrifuged, the polyimide tends to accumulate in the V-grooves 50, so that the depth of polyimide layer 40 from the bottom of a V-groove 50 to the top of the polyimide layer 40 is approximately 7.0 micrometers. The base polyimide layer 40 is thus useful as a base layer for further filter layers placed thereover, as a low-cost blocker of infrared light, and also may serve to reduce microchipping by flying silicone during a mechanical dicing step.

While this invention has been described in conjunction with various embodiments, it is evident that many alternatives, modifications, and variations will be apparent to those skilled in the art. Accordingly, it is intended to embrace all such alternatives, modifications, and variations as fall within the spirit and broad scope of the appended claims.

We claim:

1. A semiconductor chip, comprising:

a main surface including a plurality of photosites and a plurality of bonding pads defined in the main surface;

a layer of polyimide disposed over the main surface exclusive of the plurality of bonding pads, the polyimide admitting visible light therethrough and including a material for blocking infrared light; and a mask layer disposed on the main surface exclusive of the plurality of photosites and the plurality of bonding pads, the mask layer including a material substantially non-reflective of visible light.

2. The chip of claim 1, further comprising a first primary color filter layer disposed at least over a first photosite of the plurality of photosites, the first primary color filter transmitting a primary color.

3. The chip of claim 2, further comprising a second primary color filter layer disposed at least over a second photosite of the plurality of photosites, the second primary color filter transmitting a diferent primary color than the first primary color filter.

4. The chip of claim 3, wherein a portion of the first primary color filter layer overlays a portion of the second primary color filter layer on the main surface exclusive of the plurality of photosites and the plurality of bonding pads, thereby defining a mask layer on the main surface, the mask layer being substantially non-reflective of visible light.

5. A semiconductor wafer defining a plurality of chip areas on a main surface thereof, each chip area defining a circuit set separable into a separate chip, the wafer further defining an etched groove between chip areas, comprising:

a layer of polyimide, the polyimide layer covering at least one chip area, and being of a depth extending from a bottom of the etched groove to at least the main surface of the wafer, the polyimide layer being transmissive of visible light and including a material for blocking infrared light.

6. The wafer of claim 5, wherein each chip area includes a plurality of photosites and a plurality of bonding pads, and further comprising a mask layer disposed on each entire chip area of the plurality of chip areas exclusive of the plurality of photosites and the plurality of bonding pads, the mask layer including a material substantially nonreflective of visible light.

7. The wafer of claim 5, further comprising a first primary color filter layer disposed at least over a first photosite of the plurality of photosites in each of the plurality of chip areas, the first primary color filter transmitting a primary color.

8. The wafer of claim 7, further comprising a second primary color filter layer disposed at least over a second photosite of the plurality of photosites in each of the plurality of chip areas, the second primary color filter transmitting a different primary color than the first primary color filter.

9. The wafer of claim 8, wherein a portion of the first primary color filter layer overlays a portion of the second primary color filter layer exclusive of the plurality of photosites and the plurality of bonding pads in each chip area, thereby defining a mask layer in each chip area, the mask layer being substantially non-reflective of visible light.

* * * * *